US012652891B2

(12) United States Patent

Chen

(10) Patent No.: US 12,652,891 B2

(45) Date of Patent: Jun. 9, 2026

(54) MICRO LIGHT-EMITTING CHIP STRUCTURE AND MICRO DISPLAY STRUCTURE

(71) Applicant: PlayNitride Display Co., Ltd., Zhunan Township, Miaoli County (TW)

(72) Inventor: Yen-Yeh Chen, Zhunan Township (TW)

(73) Assignee: PLAYNITRIDE DISPLAY CO., LTD., Zhunan Township, Miaoli County (TW)

( * ) Notice: Subject to any disclaimer, the term of this patent is extended or adjusted under 35 U.S.C. 154(b) by 730 days.

(21) Appl. No.: 18/147,474

(22) Filed: Dec. 28, 2022

(65) Prior Publication Data

US 2024/0222568 A1    Jul. 4, 2024

(51) Int. Cl.
| | |
|---|---|
| *H01L 33/46* | (2010.01) |
| *H01L 33/42* | (2010.01) |
| *H10H 20/841* | (2025.01) |
| *H10H 20/857* | (2025.01) |
| *H10W 90/00* | (2026.01) |

(Continued)

(52) U.S. Cl.
CPC ........ *H10H 20/841* (2025.01); *H10H 20/857* (2025.01); *H10W 90/00* (2026.01);
(Continued)

(58) Field of Classification Search
CPC .. H10H 20/841; H10H 20/856; H01L 25/167; H01L 25/0753
See application file for complete search history.

(56) References Cited

U.S. PATENT DOCUMENTS

| | | | | |
|---|---|---|---|---|
| 2016/0148973 A1* | 5/2016 | Saito | ................... | H10H 20/811 257/90 |
| 2019/0115333 A1* | 4/2019 | Wu | ..................... | H01L 25/0753 |

(Continued)

FOREIGN PATENT DOCUMENTS

| | | |
|---|---|---|
| CN | 112259658 A | 1/2021 |
| KR | 10-2008-0002161 A | 1/2008 |

(Continued)

OTHER PUBLICATIONS

Chinese Office Action and Search Report for Chinese Application No. 202211693360.5, dated Jun. 18, 2025.
(Continued)

*Primary Examiner* — Kretelia Graham
*Assistant Examiner* — David J Goodwin
(74) *Attorney, Agent, or Firm* — Birch, Stewart, Kolasch & Birch, LLP

(57)    ABSTRACT

A micro light-emitting chip structure includes a first-type semiconductor layer, a light-emitting layer, and a second-type semiconductor layer having a peripheral surface and an end surface. The micro light-emitting chip structure includes a first insulating layer, a reflective layer, and a second insulating layer that cover at least the peripheral surface and the end surface. The reflective layer is disposed on the first insulating layer. The second insulating layer is disposed on the reflective layer. The micro light-emitting chip structure includes an electrode disposed on the end surface and connected to the second-type semiconductor layer and a dielectric structure between the electrode and the reflective layer. The dielectric structure is connected to the first insulation layer and the second insulation layer and closes the part of the reflective layer adjacent to the electrode on the end surface, so as to electrically insulate the electrode from the reflective layer.

20 Claims, 10 Drawing Sheets

(51) Int. Cl.

| | | |
|---|---|---|
| *H10H 20/825* | (2025.01) | |
| *H10W 72/20* | (2026.01) | |
| *H10W 72/30* | (2026.01) | |
| *H10W 74/15* | (2026.01) | |

(52) U.S. Cl.
CPC ......... *H10H 20/825* (2025.01); *H10W 72/227* (2026.01); *H10W 72/232* (2026.01); *H10W 72/242* (2026.01); *H10W 72/248* (2026.01); *H10W 72/334* (2026.01); *H10W 72/353* (2026.01); *H10W 74/15* (2026.01); *H10W 90/722* (2026.01); *H10W 90/732* (2026.01)

(56) References Cited

U.S. PATENT DOCUMENTS

| | | | | |
|---|---|---|---|---|
| 2020/0357955 A1* | 11/2020 | Chuang | .............. | H10H 20/8314 |
| 2021/0366981 A1* | 11/2021 | Yeon | ................... | H10K 59/122 |

FOREIGN PATENT DOCUMENTS

| | | | |
|---|---|---|---|
| KR | 10-2019-0140435 A | 12/2019 | |
| KR | 10-2021-0070926 A | 6/2021 | |
| KR | 10-2021-0144983 A | 12/2021 | |
| TW | 202036933 A | 10/2020 | |
| TW | 202234721 A | 9/2022 | |

OTHER PUBLICATIONS

Korean Office Action for Korean Application No. 10-2023-0190153, dated Aug. 18, 2025, with English translation.

* cited by examiner

100

MICRO LIGHT-EMITTING CHIP STRUCTURE AND MICRO DISPLAY STRUCTURE

BACKGROUND OF THE INVENTION

Field of the Invention

The present invention relates to a micro light-emitting chip structure, and, in particular, to a micro light-emitting chip structure that includes a reflective layer covering at least the peripheral surface and the end surface of the second insulating layer, and a micro display structure using the same.

Description of the Related Art

With the advancement of optoelectronic technology, the volume of many optoelectronic components is gradually miniaturized. Compared with organic light-emitting diode (OLED) technology, micro light-emitting diodes (mLEDs/μLEDs) have the advantages of high efficiency, longer lifetime, and relatively stable materials that are not prone to be affected by the environment. Therefore, displays using micro light-emitting diodes fabricated in arrays are increasingly gaining attention in the market.

Recently, the technical trend in micro light-emitting diodes has been toward increasing the number of pixels per inch (PPI) in order to further improve the image resolution of the display. To achieve this objective, manufacturers have used a number of methods to reduce the pixel size of the micro light-emitting chip structure, one of which has been narrowing the process line width and adopting an array structure for a common electrode. However, with the pixel sizes are decreased as time goes by, the design and fabrication of micro light-emitting chip structures continue to face various challenges. For example, since the forward light-emitting area of a micro light-emitting chip structure is greatly reduced, it is necessary to form a reflective layer on the sidewall that can reflect light to improve the light-emitting efficiency. When the pixel size is smaller, the difficulty of manufacturing this type of layer will also be significantly increased, and the micro light-emitting chip structure will be accompanied by a higher risk of failure. These problems need to be solved by improving the design of the micro slight-emitting chip structure.

BRIEF SUMMARY OF THE INVENTION

According to some embodiments of the present disclosure, a micro light-emitting chip structure and a micro display structure using the same are provided. The micro light-emitting chip structure includes a reflective layer covering at least the peripheral surface and the end surface of the second insulating layer, which may reflect the light out of the desired direction to increase the amount of forward light output, thereby effectively improving the light-emitting efficiency of the micro light-emitting chip structure and the micro display structure using the same.

An embodiment of the present invention includes a micro light-emitting chip structure. The micro light-emitting chip structure includes a first-type semiconductor layer, a light-emitting layer disposed on the first-type semiconductor layer, and a second-type semiconductor layer that is disposed on the side of the light-emitting layer that is opposite the first-type semiconductor layer. The second-type semiconductor layer has a peripheral surface and an end surface that is connected to the peripheral surface. The micro light-emitting chip structure also includes a first insulating layer covering at least the peripheral surface and the end surface, a reflective layer disposed on the first insulating layer and covering at least the peripheral surface and the end surface, and a second insulating layer disposed on the reflective layer and covering at least the peripheral surface and the end surface. The micro light-emitting chip structure further includes an electrode disposed on the end surface and connected to the second-type semiconductor layer. The electrode is adjacent to the reflective layer on the end surface. Moreover, the micro light-emitting chip structure includes a dielectric structure between the electrode and the reflective layer. The dielectric structure is connected to the first insulation layer and the second insulation layer and closes the part of the reflective layer that is adjacent to the electrode on the end surface, so as to electrically insulate the electrode from the reflective layer.

An embodiment of the present invention also includes a micro display structure. The micro display structure includes a display substrate and micro light-emitting chip structures arranged on the display substrate. The micro light-emitting chip structure includes a first-type semiconductor layer, a light-emitting layer disposed on the first-type semiconductor layer, and a second-type semiconductor layer disposed on the side of the light-emitting layer that is opposite the first-type semiconductor layer. The second-type semiconductor layer has a peripheral surface and an end surface that is connected to the peripheral surface. The micro light-emitting chip structure also includes a first insulating layer covering at least the peripheral surface and the end surface, a reflective layer disposed on the first insulating layer and covering at least the peripheral surface and the end surface, and a second insulating layer disposed on the reflective layer and covering at least the peripheral surface and the end surface. The micro light-emitting chip structure further includes an electrode disposed on the end surface and connected to the second-type semiconductor layer. The electrode is adjacent to the reflective layer on the end surface. Moreover, the micro light-emitting chip structure includes a dielectric structure between the electrode and the reflective layer. The dielectric structure is connected to the first insulation layer and the second insulation layer and closes the part of the reflective layer that is adjacent to the electrode on the end surface, so as to electrically insulate the electrode from the reflective layer. The electrode is electrically connected to the display substrate, and the first insulating layer, the reflective layer, and the second insulating layer extend toward the light-emitting layer and the first-type semiconductor layer along the peripheral surface and cover the light-emitting layer and a part of the first-type semiconductor layer. The micro display structure also includes an ohmic contact layer patterned between the micro light-emitting chip structures and electrically connected to the first-type semiconductor layer of the micro-light-emitting chip structures.

BRIEF DESCRIPTION OF THE DRAWINGS

The disclosure can be more fully understood from the following detailed description when read with the accompanying figures. It is worth noting that, in accordance with standard practice in the industry, various features are not drawn to scale. In fact, the dimensions of the various features may be arbitrarily increased or reduced for clarity of discussion.

DETAILED DESCRIPTION OF THE INVENTION

Figure 1:
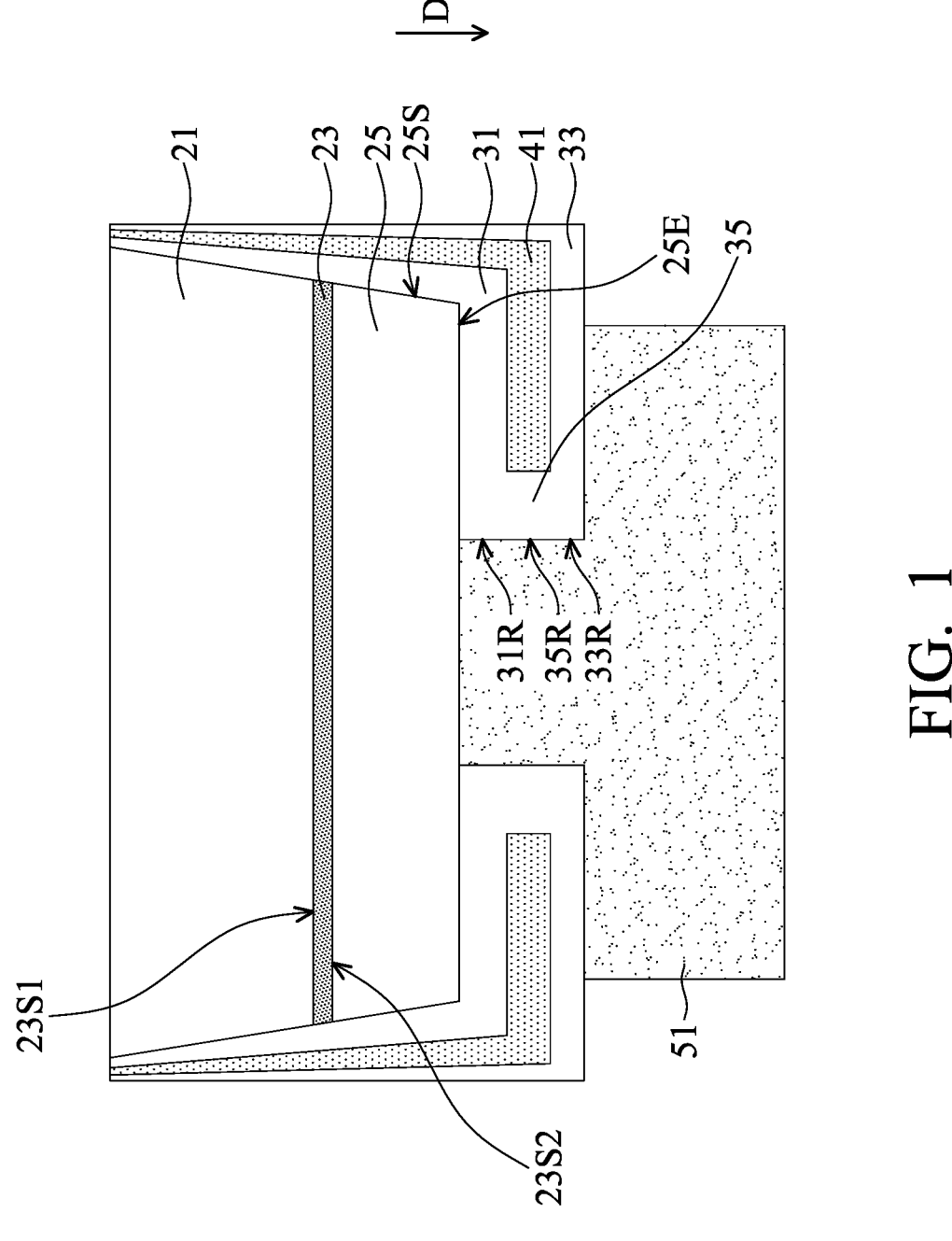
FIG. 1 is a cross-sectional view illustrating a portion of the micro light-emitting chip structure according to some embodiments of the present disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, a first feature is formed on a second feature in the description that follows may include embodiments in which the first feature and second feature are formed in direct contact, and may also include embodiments in which additional features may be formed between the first feature and second feature, so that the first feature and second feature may not be in direct contact.

It should be understood that additional steps may be implemented before, during, or after the illustrated methods, and some steps might be replaced or omitted in other embodiments of the illustrated methods.

Furthermore, spatially relative terms, such as "beneath," "below," "lower," "on," "above," "upper" and the like, may be used herein for ease of description to describe one element or feature's relationship to other elements or features as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the present disclosure, the terms "about," "approximately" and "substantially" typically mean +/−20% of the stated value, more typically +/−10% of the stated value, more typically +/−5% of the stated value, more typically +/−3% of the stated value, more typically +/−2% of the stated value, more typically +/−1% of the stated value and even more typically +/−0.5% of the stated value. The stated value of the present disclosure is an approximate value. That is, when there is no specific description of the terms "about," "approximately" and "substantially", the stated value includes the meaning of "about," "approximately" or "substantially".

Unless otherwise defined, all terms (including technical and scientific terms) used herein have the same meaning as commonly understood by one of ordinary skill in the art to which this disclosure belongs. It should be understood that terms such as those defined in commonly used dictionaries should be interpreted as having a meaning that is consistent with their meaning in the context of the relevant art and will not be interpreted in an idealized or overly formal sense unless expressly so defined in the embodiments of the present disclosure.

The present disclosure may repeat reference numerals and/or letters in following embodiments. This repetition is for the purpose of simplicity and clarity and does not in itself dictate a relationship between the various embodiments and/or configurations discussed.

FIG. 1 is a cross-sectional view illustrating a portion of the micro light-emitting chip structure 10 according to some embodiments of the present disclosure. For example, the micro light-emitting chip structure 10 may be a micro light-emitting diode (micro LED). It should be noted that some components of the micro light-emitting chip structure 10 have been omitted in FIG. 1 for the sake of brevity.

Referring to FIG. 1, in some embodiments, the micro light-emitting chip structure 10 includes a first-type semiconductor layer 21. In some embodiments, the first-type semiconductor layer 21 includes an N-type semiconductor material. For example, the first-type semiconductor layer 21 may include a group II-VI material (e.g., zinc selenide (ZnSe)) or a group III-V nitrogen compound material (e.g., gallium nitride (GaN), aluminum nitride (AlN), indium nitride (InN), indium gallium nitride (InGaN), aluminum gallium nitride (AlGaN) or aluminum indium gallium nitride (AlInGaN)), and the first-type semiconductor layer 21 may include dopants such as silicon (Si) or germanium (Ge), but the present disclosure is not limited thereto. Moreover, the first-type semiconductor layer 21 may be a single-layer or multi-layer structure.

Referring to FIG. 1, in some embodiments, the micro light-emitting chip structure 10 includes a light-emitting layer 23 disposed on the first-type semiconductor layer 21. The light-emitting layer 23 may include at least one undoped semiconductor layer or at least one low-doped semiconductor layer. For example, the light-emitting layer 23 may be a quantum well (QW) layer, which may include indium gallium nitride ($In_xGa_{1-x}N$) or gallium nitride (GaN), but the present disclosure is not limited thereto. Alternately, the light-emitting layer 23 may be a multiple quantum well (MQW) layer.

Lights emitted by the micro light-emitting chip structure 10 may be determined by the light-emitting layer 23. For example, the light-emitting layer 23 may emit red light, green light, or blue light, but the present disclosure is not limited thereto. The light-emitting layer 23 may also emit white light, cyan light, magenta light, yellow light, any other applicable color light, or a combination thereof.

Referring to FIG. 1, in some embodiments, the micro light-emitting chip structure 10 includes a second-type semiconductor layer 25 disposed on the side of the light-emitting layer 23 that is opposite the first-type semiconductor layer 21. For example, as shown in FIG. 1, the first-type semiconductor layer 21 is disposed on the first side 23S1 of the light-emitting layer 23, and the second-type semiconductor layer 25 is disposed on the second side 23S2 of the light-emitting layer 23. In some embodiments, the second-type semiconductor layer 25 includes a P-type semiconductor material. For example, the second-type semiconductor layer 25 may include a group II-VI material (e.g., zinc selenide (ZnSe)) or a group III-V nitrogen compound material (e.g., gallium nitride (GaN), aluminum nitride (AlN), indium nitride (InN), indium gallium nitride (InGaN), aluminum gallium nitride (AlGaN) or aluminum indium gallium nitride (AlInGaN)), and the second-type semiconductor layer 25 may include dopants such as magnesium (Mg) or carbon (C), but the present disclosure is not limited thereto. Moreover, the second-type semiconductor layer 25 may be a single-layer or multi-layer structure.

As shown in FIG. 1, in some embodiments, the second-type semiconductor layer 25 has a peripheral surface 25S and an end surface 25E that is connected to the peripheral surface 25S. In the embodiment shown in FIG. 1, the end surface 25E of the second-type semiconductor layer 25 is a single flat surface, but the present disclosure is not limited thereto. In some other embodiments, the end surface 25E of the second-type semiconductor layer 25 is not limited to a single surface, and may also be or includes an uneven surface.

The first-type semiconductor layer 21, the light-emitting layer 23, and the second-type semiconductor layer 25 may be formed by an epitaxial growth process. For example, the epitaxial growth process may include metal organic chemical vapor deposition (MOCVD), hydride vapor phase epitaxy (HVPE), molecular beam epitaxy (molecular beam epitaxy, MBE), any other applicable method, or a combination thereof.

Referring to FIG. 1, in some embodiments, the micro light-emitting chip structure 10 includes a first insulating layer 31 covering at least the peripheral surface 25S and the end surface 25E of the second-type semiconductor layer 25. For example, the first insulating layer 31 may include an inorganic insulating material, such as silicon oxide (SiO$_2$), silicon nitride (SiN$_x$), aluminum oxide (Al$_2$O$_3$), titanium oxide (TiO$_2$), similar materials, or a combination thereof, but the present disclosure is not limited thereto.

The first insulating layer 31 may be formed by a deposition process and a patterning process. The deposition process may include chemical vapor deposition (CVD), atomic layer deposition (ALD), any other applicable method, or a combination thereof, but the present disclosure is not limited thereto. The patterning process may include forming a mask layer (not shown) on the aforementioned material, and then etching the portion of the aforementioned material covered by the mask layer (or the portion not covered by the mask layer), but the present disclosure is not limited thereto. The patterning process may also include a dry etching process or a wet etching process.

Referring to FIG. 1, in some embodiments, the micro light-emitting chip structure 10 includes a reflective layer 41 disposed on the first insulating layer 31 and covering at least the peripheral surface 25S and the end surface 25E of the second-type semiconductor layer 25. In some embodiments, the reflective layer 41 is a conductor. For example, the reflective layer 41 may include metal, such as titanium (Ti), aluminum (Al), silver (Ag), gold (Au), platinum (Pt), nickel (Ni), copper (Cu), the like, an alloy thereof, a multilayer stack thereof, or a combination thereof, but the present disclosure is not limited thereto. The reflective layer 41 may be formed by a deposition process and a patterning process. The examples of the deposition process and the patterning process are mentioned above and will not be repeated here.

Referring to FIG. 1, in some embodiments, the micro light-emitting chip structure 10 includes a second insulating layer 33 disposed on the reflective layer 41 and covering at least the peripheral surface 25S and the end surface 25E of the second-type semiconductor layer 25. The second insulating layer 33 may include the same or similar material as the first insulating layer 31, and may be formed by the same or similar process as the first insulating layer 31, which will not be repeated here, but the present disclosure is not limited thereto.

In the embodiment of the present disclosure, the first insulating layer 31, the reflective layer 41, and the second insulating layer 33 may form an insulator-metal-insulator (IMI) structure. As shown in FIG. 1, in some embodiments, the first insulating layer 31, the reflective layer 41, and the second insulating layer 33 conformally cover the peripheral surface 25S and a part of the end surface 25E. Moreover, as shown in FIG. 1, in some embodiments, the first insulating layer 31, the reflective layer 41, and the second insulating layer 33 extend toward the light-emitting layer 23 and the first-type semiconductor layer 21 along the peripheral surface 25S and cover the light-emitting layer 23 and a part of the first-type semiconductor layer 21.

Referring to FIG. 1, in some embodiments, the micro light-emitting chip structure 10 includes an electrode 51 disposed on the end surface 25E of the second-type semiconductor layer 25 and connected to the second-type semiconductor layer 25. That is, the electrode 51 is in direct contact to the second-type semiconductor layer 25. Moreover, the electrode 51 is adjacent to the reflective layer 41 on the end surface 25E of the second-type semiconductor layer 25. The electrode 51 may include a conductive material, such as metal, metal silicide, the like, or a combination thereof. For example, the metal may be gold (Au), nickel (Ni), platinum (Pt), palladium (Pd), iridium (Ir), titanium (Ti), chromium (Cr), tungsten (W), aluminum (Al), copper (Cu), the like, an alloy thereof, or a combination thereof, but the present disclosure is not limited thereto.

As shown in FIG. 1, in some embodiments, the electrode 51 and the reflective layer 41 completely cover the peripheral surface 25S and the end surface 25E of the second-type semiconductor layer 25. In other words, the orthogonal projections of the electrode 51 and the reflective layer 41 on a reference plane parallel to the light-emitting layer 23 completely covers the orthogonal projection of the first-type semiconductor layer 21, the light-emitting layer 23, or the second-type semiconductor layer 25 on the reference plane.

The micro light-emitting chip structure 10 also includes a dielectric structure 35 between the electrode 51 and the reflective layer 41. The dielectric structure 35 is connected to the first insulation layer 31 and the second insulation layer 33 and closes a part of the reflective layer 41 adjacent to the electrode 51 on the end surface 25E of the second-type semiconductor layer 25, so as to electrically insulate the electrode 51 from the reflective layer 41.

In this embodiment, the dielectric structure 35 includes the same or similar material as the first insulating layer 31 or the second insulating layer 33. In other words, the first insulating layer 31, the second insulating layer 33, and the dielectric structure 35 may be regarded as the same component, but the present disclosure is not limited thereto.

In some embodiments, the first insulating layer 31, the dielectric structure 35, and the second insulating layer 33 each have an annular contact surface with the electrode 51 on the end surface 25E of the second-type semiconductor layer 25. The annular contact surface 31R of the first insulating layer 31, the annular contact surface 35R of the dielectric structure 35, and the annular contact surface 33R of the second insulating layer 33 are aligned with each other in the thickness direction of the end surface 25E of the second-type semiconductor layer 25 (i.e., direction D1 in FIG. 1).

As shown in FIG. 1, the peripheral surface 25S of the second-type semiconductor layer 25 is an inclined surface, and the cross-sectional width of the second-type semiconductor layer 25 gradually narrows in the direction that is parallel to the light-emitting layer 23 (i.e., direction D1 in FIG. 1) toward the electrode 51. In this embodiment, since the first insulating layer 31, the reflective layer 41, and the second insulating layer 33 conformally cover the peripheral surface 25S and a part of the end surface 25E of the second-type semiconductor layer 25 (that is, the base surface covered by the insulation-metal-insulation conformal structure (i.e., the peripheral surface 25S of the second-type semiconductor layer 25) is not a steep surface), which may ensure that the reflective layer 41 is uniformly formed on the peripheral surface 25S of the second-type semiconductor layer 25 during the deposition process.

Moreover, the gradual-narrowing cross-sectional width of the second-type semiconductor layer 25 may reduce the incident angle of most incident light on the first insulating layer 31 from the light-emitting layer 23, so that the light is easily transmitted to the reflective layer 41 for reflection, and the probability of total reflection along the surface of the first insulating layer 31 is reduced, thereby effectively improving the overall light-emitting efficiency of the micro light-emitting chip structure.

Figure 2:
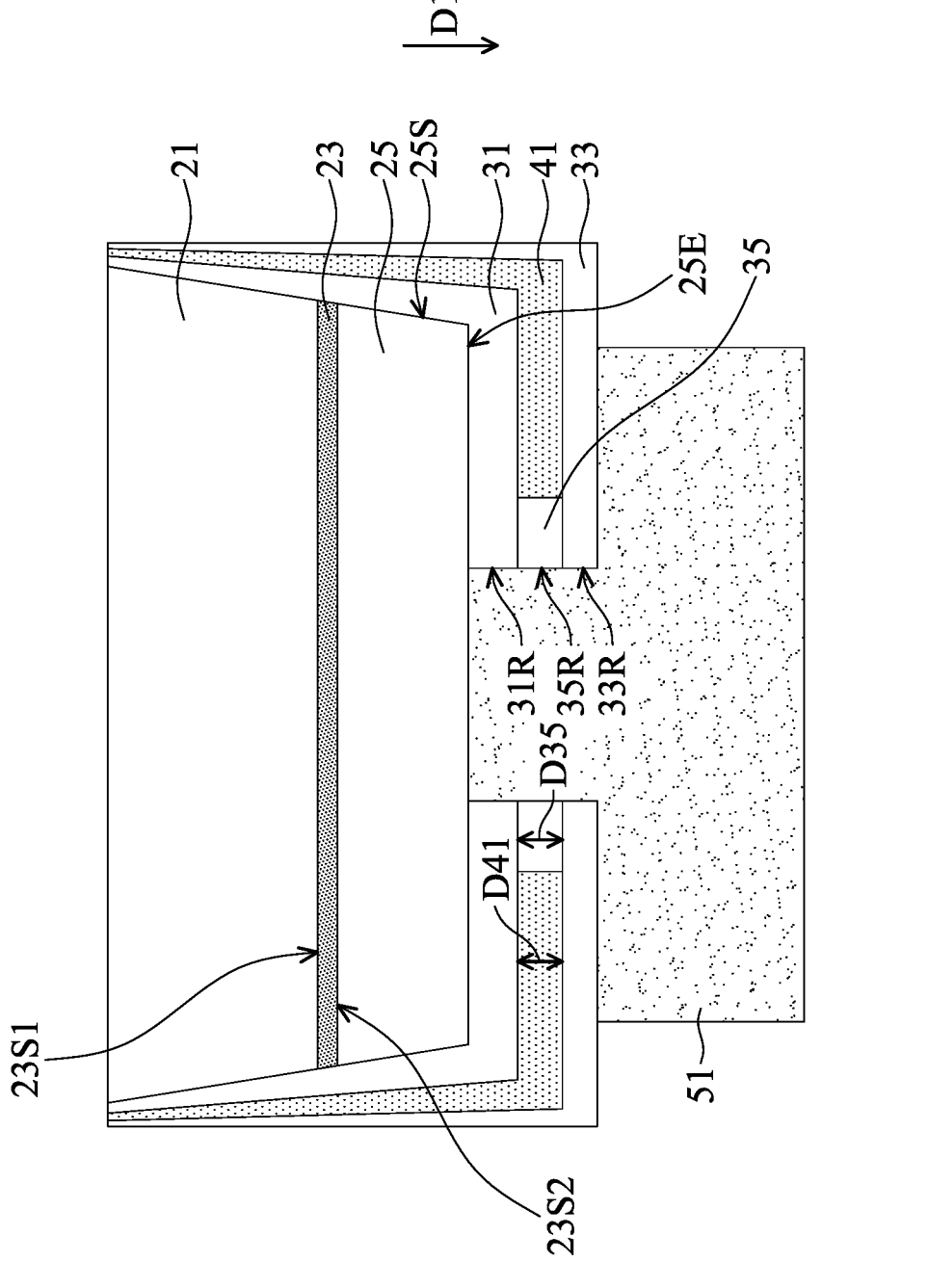
FIG. 2 is a cross-sectional view illustrating a portion of the micro light-emitting chip structure according to some embodiments of the present disclosure.

FIG. 2 is a cross-sectional view illustrating a portion of the micro light-emitting chip structure 12 according to some embodiments of the present disclosure. For example, the micro light-emitting chip structure 12 may be a micro light-emitting diode (micro LED). Similarly, some components of the micro light-emitting chip structure 12 have been omitted in FIG. 2 for the sake of brevity.

As shown in FIG. 2, in some embodiments, the dielectric structure 35 of the micro light-emitting chip structure 12 is made of different material than the first insulating layer 31 and the second insulating layer 33. For example, the dielectric structure 35 may include organic materials, structural photoresist materials, any other similar material, or a combination thereof, but the present disclosure is not limited thereto. As shown in FIG. 2, in some embodiments, the dielectric structure 35 is a ring structure formed between the first insulating layer 31 and the second insulating layer 33.

In this embodiment, when manufacturing the micro light-emitting chip structure 12, the different etching selectivities between the first insulating layer 31 (and the second insulating layer 33) and the reflective layer 41 may be utilized, so that the reflective layer 41 has a larger etching (shrinkage) degree than the first insulating layer 31 and the second insulating layer 33. Therefore, it is ensured that the reflective layer 41 is electrically insulated from the electrode 51 under the premise that the insulating-metal-insulating conformal structure has as large a coverage area as possible.

Moreover, in this embodiment, the dielectric structure 35 and the reflective layer 41 are in the same stacked film layer, and have the same thickness as the reflective layer 41 in the thickness direction, which is perpendicular to the end surface 25E of the second-type semiconductor layer 25 (i.e., direction D1 in FIG. 2). In other words, the thickness D35 of the dielectric structure 35 may be substantially the same as the thickness D41 of the reflective layer 41, but the present disclosure is not limited thereto.

Figure 3:
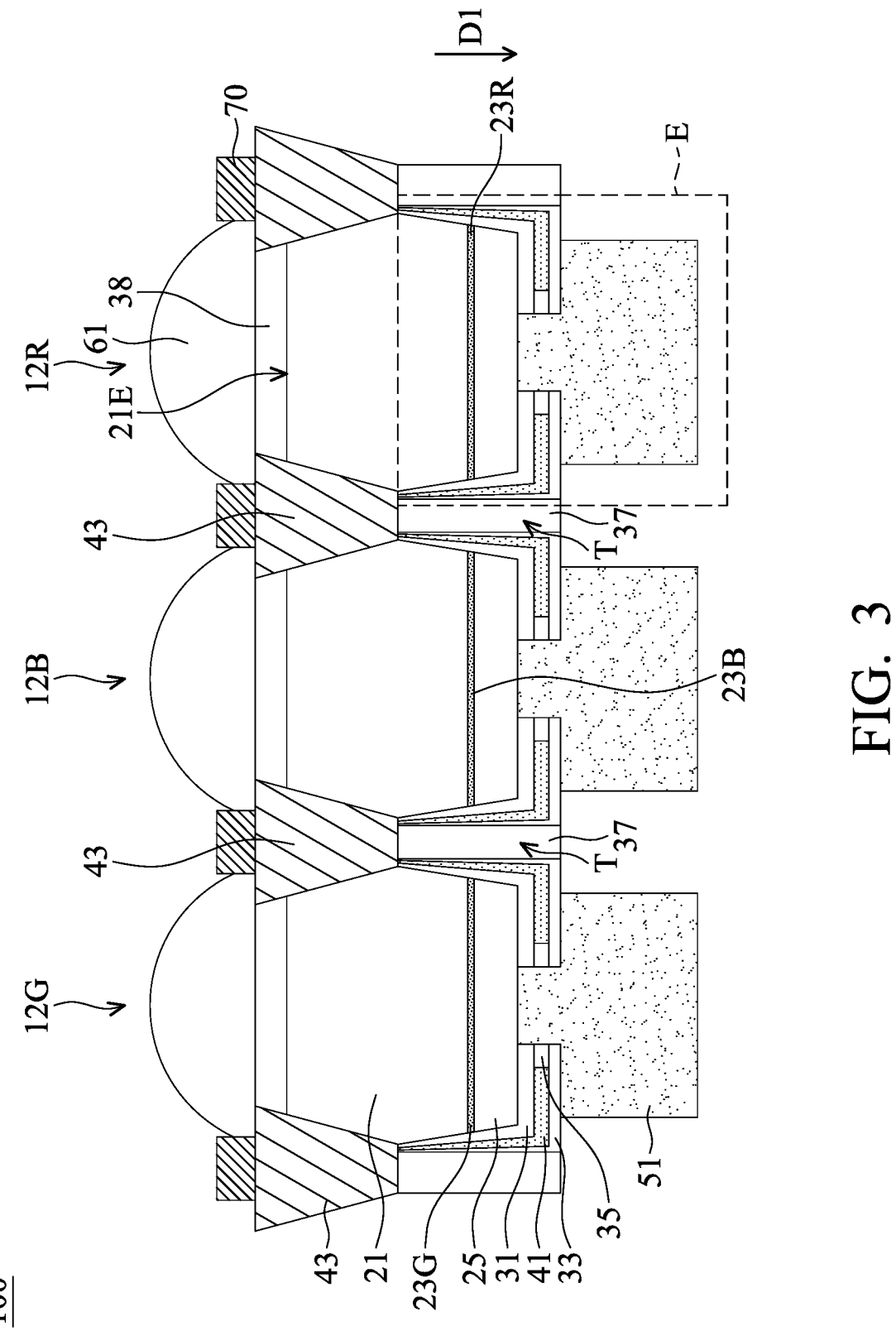
FIG. 3 is a cross-sectional view illustrating a portion of the micro display structure according to some embodiments of the present disclosure.

FIG. 3 is a cross-sectional view illustrating a portion of the micro display structure 100 according to some embodiments of the present disclosure. For example, the micro display structure 100 may be a micro light-emitting diode (micro LED) display panel. Similarly, some components of the micro display structure 100 have been omitted in FIG. 3 for the sake of brevity.

Referring to FIG. 3, in some embodiments, the micro display structure 100 includes multiple micro light-emitting chip structures (only three are shown in FIG. 3). In some embodiments, multiple micro light-emitting chip structures may be arranged in an array. For example, the micro display structure 100 may include micro light-emitting chip structures 12G, 12B, and 12R, wherein the light-emitting layer 23G of the micro light-emitting chip structure 12G emits green light, the light-emitting layer 23B of the micro light-emitting chip structure 12B emits blue light, and the light-emitting layer 23R of the micro light-emitting chip structure 12R emits red light. That is, the micro-light-emitting chip structures 12G, 12B, and 12R emit lights of different colors, but the present disclosure is not limited thereto.

As shown in FIG. 3, in some embodiments, the micro light-emitting chip structures 12G, 12B, and 12R have the same or similar structure as the micro light-emitting chip structure 12 shown in FIG. 2. For example, the micro light-emitting chip structure 12 shown in FIG. 2 may be, for example, an enlarged view of region E in FIG. 3.

Referring to FIG. 3, in some embodiments, the micro display structure 100 includes an ohmic contact layer 43 patterned between the micro light-emitting chip structures 12G, 12B, and 12R and electrically connected to at least a portion of the first-type semiconductor layer 21 of the micro-light-emitting chip structures 12G, 12B, and 12R. For example, in FIG. 3, the ohmic contact layer 43 covers the upper half of the first-type semiconductor layers 21, and the ohmic contact layer 43 is connected to at least one of the first insulating layer 31, the reflective layer 41, and the second insulating layer 33. In this embodiment, the ohmic contact layer 43 is simultaneously connected to the first insulating layer 31, the reflective layer 41, and the second insulating layer 33, but the present disclosure is not limited thereto. For example, in other embodiments described later, the ohmic contact layer 43 may only contact the first insulating layer 31 and the reflective layer 41, or only contact the first insulating layer 31.

In this embodiment, the ohmic contact layer 43 is substantially a common electrode structure (e.g., a patterned metal layer). In addition, since the ohmic contact layer 43 is connected to the reflective layer 41, the reflective layer 41 may also be regarded as a part of the common electrode structure, so that a part of the current of the first-type semiconductor layer 21 may be transmitted through the reflective layer 41, thereby improving the effect of the common electrode of the ohmic contact layer 43. Moreover, when the ohmic contact layer 43 includes a light-reflecting material and connected to the reflective layer 41, it may completely close the sides of the micro light-emitting chip structures 12G, 12B, and 12R, prevent light leakage from the junction, and enhance the effect of light recycling and reflection.

As shown in FIG. 3, there are gaps between the micro light-emitting chip structures 12G, 12B, and 12R to form multiple trenches T. In the thickness direction that is perpendicular to the end surface 25E of the second-type semiconductor layer 25 (i.e., direction D1 in FIG. 3), these trenches T are between the ohmic contact layer 43 and the electrode 51, and the micro display structure 100 further includes multiple third insulating layers 37 that fill the trenches T. Filling the trench T with the third insulating layer 37 may prevent the common electrode of the ohmic contact layer 43 from being in contact with the electrode 51 due to process shift when depositing the electrode 51, resulting in a PN short circuit.

It should be noted that although it is shown in FIG. 3 that the third insulating layer 37 completely fill the trench T, the present disclosure is not limited thereto. In some other embodiments, the third insulating layer 37 may only occupy part of the space of the trench T, which can still effectively isolate the ohmic contact layer 43 and the electrode 51 to prevent short circuits.

As shown in FIG. 3, in some embodiments, the first-type semiconductor layer 21 has a light-emitting surface 21E on the side facing away from the light-emitting layer 23, and the micro display structure 100 further includes a refractive structure 61 disposed on the light-emitting surface 21E of the first-type semiconductor layer 21. The refractive structure 61 may be a micro-lens. For example, the micro-lens may include a semi-convex lens or a convex lens, but the present disclosure is not limited thereto. The refractive structure 61 may also include micro-pyramid structures (e.g., cones, quadrangular pyramids, etc.) or micro-trapezoidal structures (e.g., flat-topped cones, flat-topped quadrangular pyramids, etc.). Alternatively, the refractive structure 61 may be a gradient-index structure. As shown in FIG. 3, in some embodiments, the micro display structure 100 further includes a hard mask 38 disposed between the first-type semiconductor layer 21 and the refractive structure 61. The hard mask layer 38 may be used as a protective layer of the first-type semiconductor layer 21, and includes the same or similar materials as the first insulating layer 31 and the second insulating layer 33, but the present disclosure are not limited thereto.

As shown in FIG. 3, in some embodiments, the micro display structure 100 further includes multiple light-shielding layers 70 disposed on the ohmic contact layer 43 and between the refractive structures 61. For example, the light-shielding layer 70 may correspond to the junction of the micro light-emitting chip structures 12G, 12B, and 12R. The light-shielding layer 70 may include photoresist (e.g., black photoresist, or other applicable photoresist which is not transparent), ink (e.g., black photoresist to absorb light or white photoresist to reflect light), molding compound, solder mask, epoxy polymer, any other applicable material, or a combination thereof. Moreover, the light-shielding layer 70 may include a light curing material, a thermal curing material, or a combination thereof, but the present disclosure is not limited thereto. The light-shielding layer 70 may form a black matrix to prevent crosstalk between the micro light-emitting chip structures 12G, 12B, and 12R.

Figure 4A:
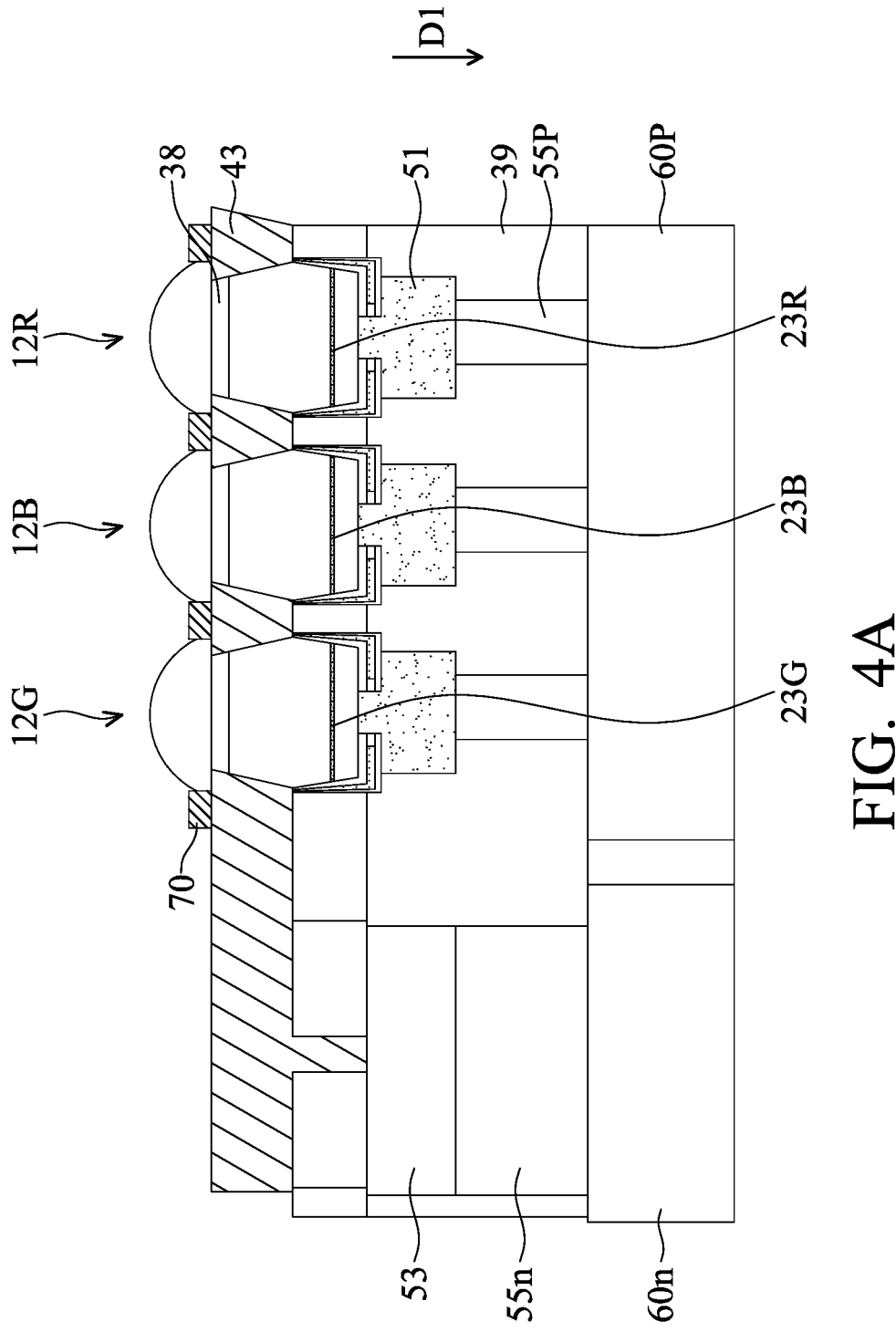
FIG. 4A is a cross-sectional view illustrating a portion of the micro display structure according to some embodiments of the present disclosure.
Figure 4B:
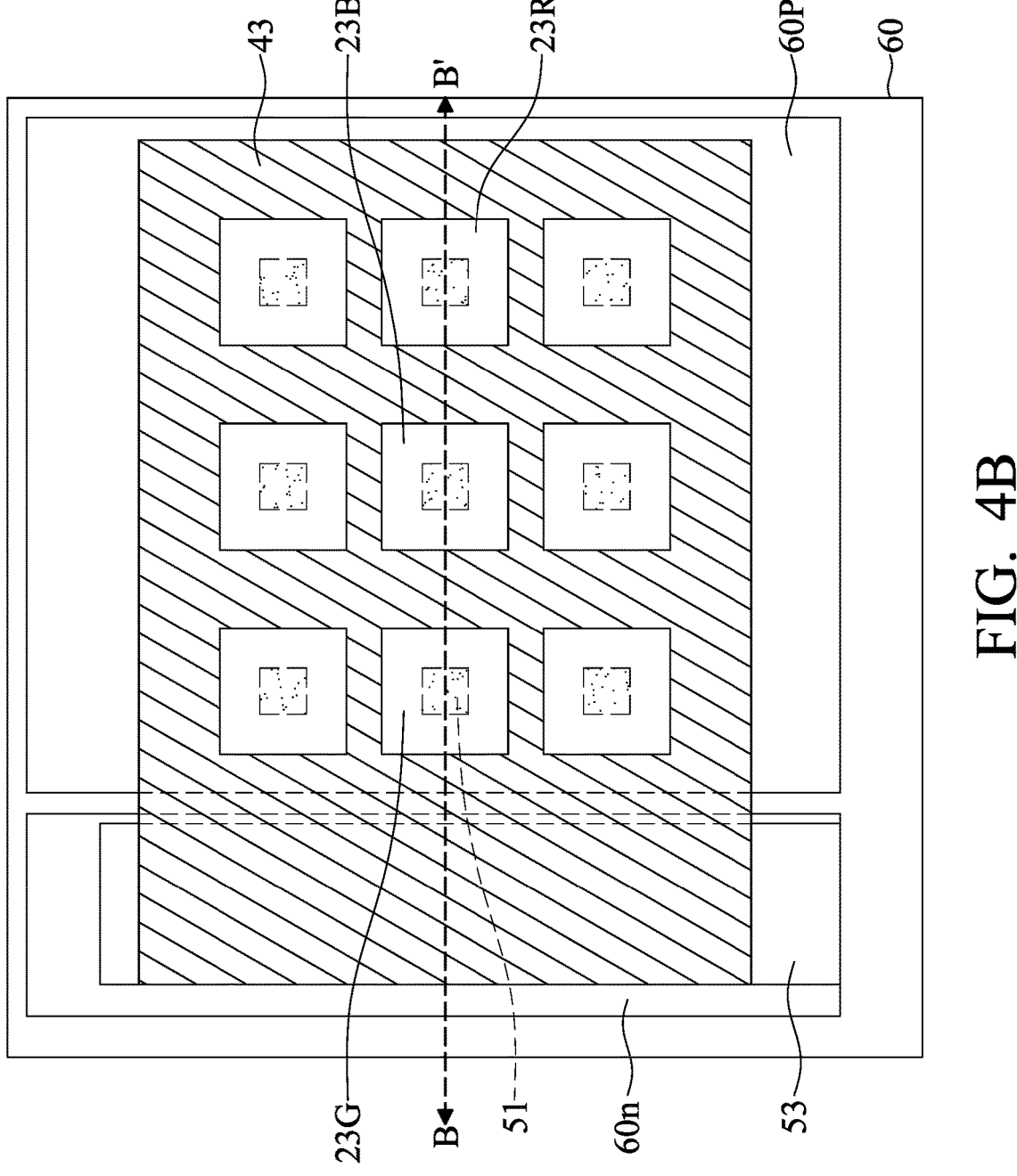
FIG. 4B is a top view of a portion of the micro display structure according to some embodiments of the present disclosure.

FIG. 4A is a cross-sectional view illustrating a portion of the micro display structure 100 according to some embodiments of the present disclosure. FIG. 4B is a top view of a portion of the micro display structure 100 according to some embodiments of the present disclosure. For example, the micro display structure 100 shown in FIG. 3 may be part of the micro display structure 100 shown in FIG. 4A, and FIG. 4A may be, for example, a cross-sectional view taken along line B-B' in FIG. 4B, but the present disclosure is not limited thereto. Similarly, some components of the micro display structure 100 have been omitted in FIG. 4A and FIG. 4B for the sake of brevity. Moreover, what is shown in FIG. 4B is only a part of the array structure of the micro display structure 100. For convenience of description, the boundary lines of related components are not drawn according to the actual display configuration.

Referring to FIG. 4A and FIG. 4B, the micro display structure 100 includes a display substrate 60. The display substrate 60 may include an elementary semiconductor (e.g., silicon or germanium), a compound semiconductor (e.g., silicon carbide (SiC), gallium arsenic (GaAs), indium arsenide (InAs), or indium phosphide (InP)), an alloy semiconductor (e.g., silicon germanium (SiGe), silicon germanium carbide (SiGeC), gallium arsenic phosphide (GaAsP), or gallium indium phosphide (GaInP)), any other applicable semiconductor, or a combination thereof. Referring to FIG. 4B, the micro light-emitting chip structures 12G, 12B, and 12R are arranged on the display substrate 60 and electrically connected to the display substrate 60.

The display substrate 60 may have an integrated circuit (IC) composed of various circuit layers. As shown in FIG. 4A, the circuit layers may include a p-pole 60p and an n-pole 60n. The micro light-emitting chip structures 12G, 12B, and 12R may be electrically connected to the p-pole 60p of the circuit layer through their respective electrodes 51 (e.g., the electrodes 51 are connected to the conductive channel 55p), thereby independently controlling the micro light-emitting chip structures 12G, 12B, and 12R; the common electrode structure formed by the ohmic contact layer 43 may be electrically connected to the n-pole 60n of the circuit layer through the conductive channel 55n (e.g., the ohmic contact layer 43 is connected to the pad 53, and the pad 53 is connected to the conductive channel 55n), but the present disclosure is not limited thereto.

As shown in FIG. 4A, in some embodiments, the micro display structure 100 further includes an underfill layer 39 for stabilizing the overall structure of the micro display structure 100 and preventing moisture from entering the micro display structure 100. For example, the underfill layer 39 may include the same or similar material as the first insulating layer 31 and the second insulating layer 33, but the present disclosure is not limited thereto.

Figure 5:
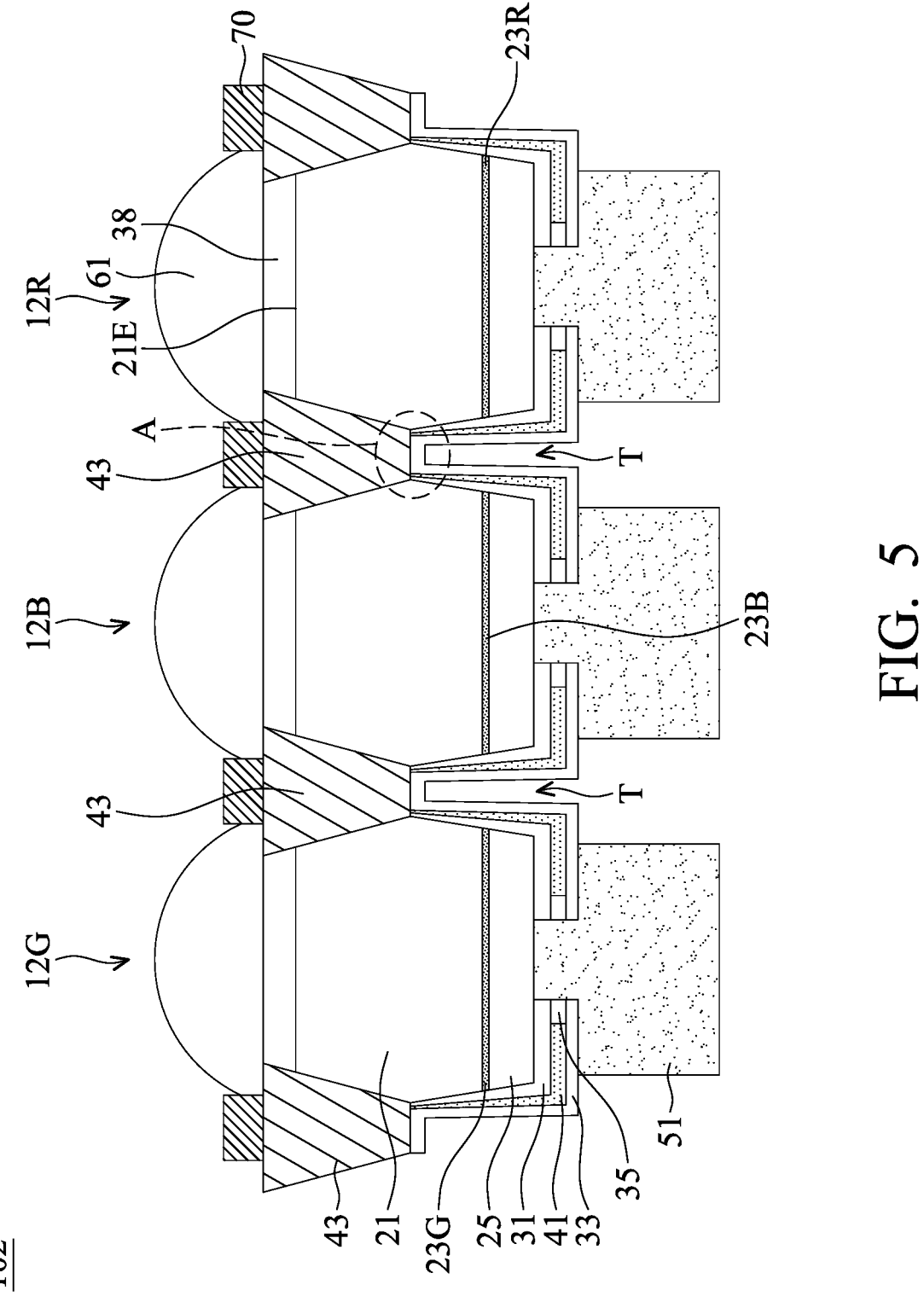
FIG. 5 is a cross-sectional view illustrating a portion of the micro display structure according to some other embodiments of the present disclosure.

FIG. 5 is a cross-sectional view illustrating a portion of the micro display structure 102 according to some other embodiments of the present disclosure. For example, the micro display structure 102 may be a micro light-emitting diode (micro LED) display panel. Similarly, some components of the micro display structure 102 have been omitted in FIG. 5 for the sake of brevity.

The main difference from the micro display structure 100 shown in FIG. 3 is that the micro display structure 102 shown in FIG. 5 does not include the third insulating layer 37. In this embodiment, the second insulating layers 33 between adjacent micro light-emitting chip structures 12G, 12B, and 12R are not etched through and connected to each other, thereby isolating the reflective layer 41 and the electrode 51.

Figure 6A:
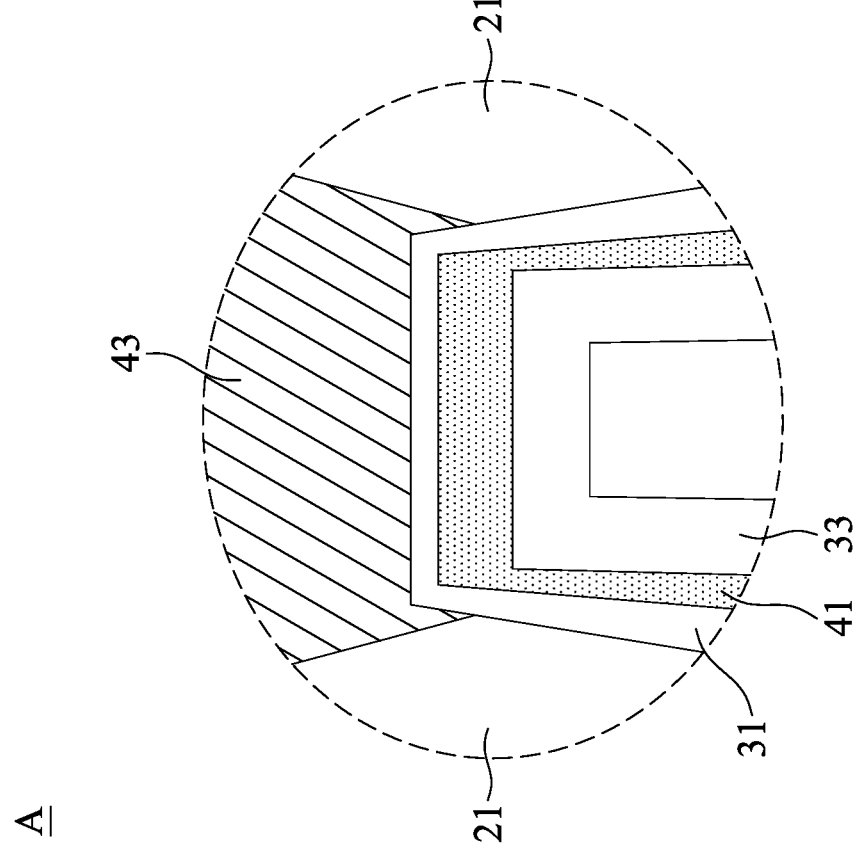
FIG. 6A, FIG. 6B, and FIG. 6C are different embodiments of the region A in FIG. 5, respectively.
Figure 6B:
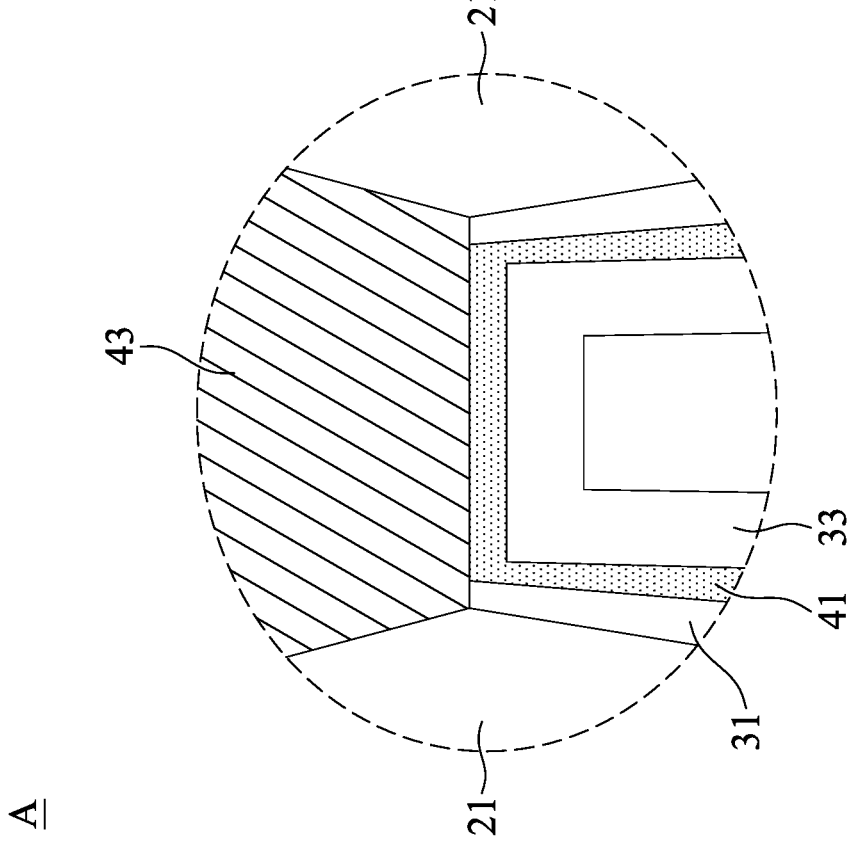
Figure 6C:
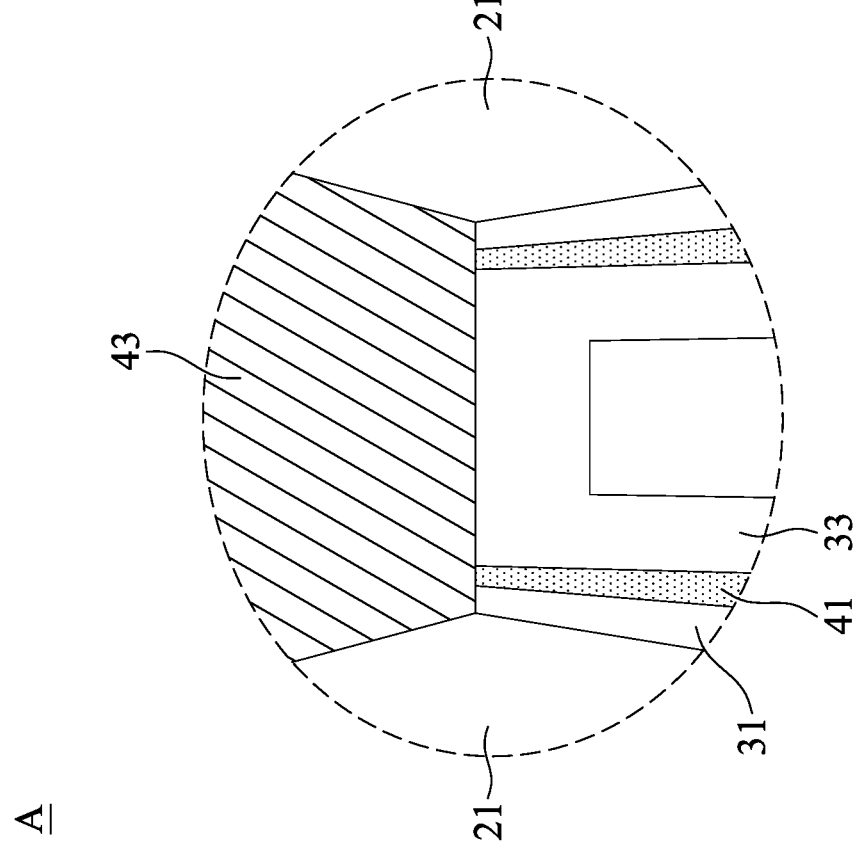

Moreover, the region A circled by the dotted line in FIG. 5 may have a different structure. FIG. 6A, FIG. 6B, and FIG. 6C are different embodiments of the region A in FIG. 5, respectively. As shown in FIG. 6A, when forming the via of the common electrode of the ohmic contact layer 43, the first insulating layer 31 is not etched through, so that the reflective layer 41 and the ohmic contact layer 43 are slightly interrupted. As shown in FIG. 6B, when forming the via of the common electrode of the ohmic contact layer 43, the first insulating layer 31 is etched through to expose the top portion of the reflective layer 41, but the ohmic contact layer 43 does not contact the second insulating layer 33. As shown in FIG. 6C, when forming the via of the common electrode of the ohmic contact layer 43, the first insulating layer 31 is etched through, and the top portion of the reflective layer 41 is further etched through, so that the ohmic contact layer 43 is in direct contact with the second insulating layer 33. In the embodiments shown in FIG. 6B and FIG. 6C, the reflective layer 41 and the ohmic contact layer 43 may form a reflective layer connected to each other without being interrupted by the first insulating layer 31, so that the micro light-emitting chip structures 12G, 12B, and 12R may be covered flawlessly, thereby improving the efficiency of light reflection.

Moreover, since the ohmic contact layer 43 is a common electrode structure in this embodiment, and the reflective layer 41 is also a conductive layer formed between the micro light-emitting chip structures 12G, 12B, and 12R in a patterned manner, in the structures of FIG. 6B and FIG. 6C, the reflective layer 41 may be regarded as an extension structure of the common electrode structure of the first-type semiconductor layer 21 (i.e., an extension structure of the ohmic contact layer 43), which has the effect of improving the conductivity of the common electrode structure.

Figure 7:
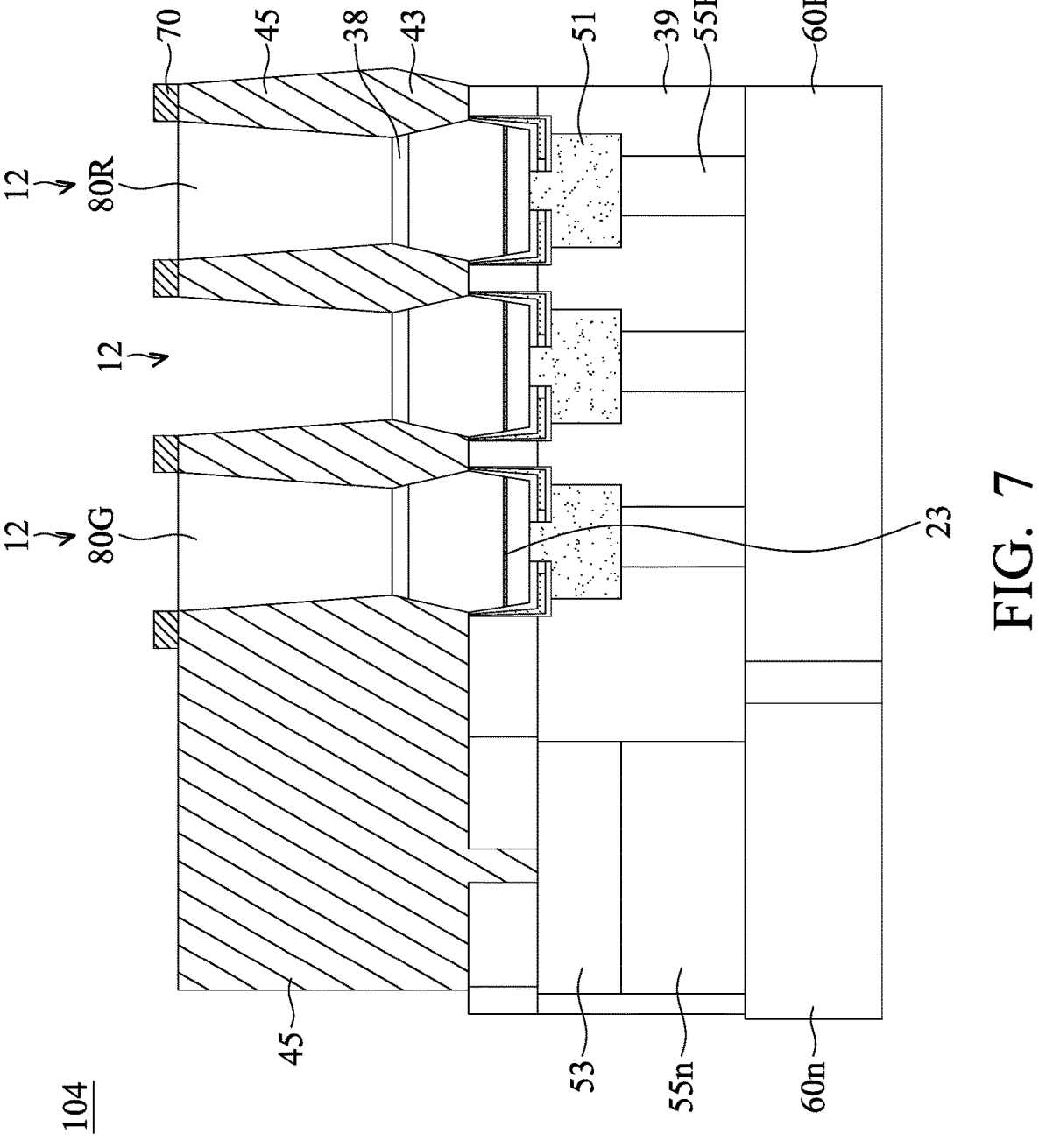
FIG. 7 is a cross-sectional view illustrating a portion of the micro display structure according to some other embodiments of the present disclosure.

FIG. 7 is a cross-sectional view illustrating a portion of the micro display structure 104 according to some other embodiments of the present disclosure. For example, the micro display structure 104 may be a micro light-emitting diode (micro LED) display panel. Similarly, some components of the micro display structure 104 have been omitted in FIG. 7 for the sake of brevity.

Referring to FIG. 7, in some embodiments, each micro light-emitting chip structure 12 emits light of the same color. In other words, the light-emitting layer 23 of each micro light-emitting chip structure 12 emits light of the same color, such as blue. In this embodiment, the micro display structure 104 further includes multiple color conversion structures 80G, 80R arranged on some micro light-emitting chip structures 12, and the color conversion structures 80G, 80R convert the light emitted by the micro light-emitting chip structure 12 into light of different colors.

For example, the color conversion structure 80G may include green phosphors or green quantum dots (QDs) to convert the blue light emitted by the micro light-emitting chip structure 12 into green light; the color conversion structure 80R may include red phosphor or red quantum dots to convert the blue light emitted by the micro light-emitting chip structure 12 into red light, but the present disclosure is not limited thereto.

As noted above, the micro light-emitting chip structure according to the embodiments of the present disclosure includes a reflective layer covering at least the peripheral surface and the end surface of the second insulating layer, which may reflect the light out of the desired direction to increase the amount of forward light output, thereby effectively improving the light-emitting efficiency of the micro light-emitting chip structure and the micro display structure using the same.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure. Therefore, the scope of protection should be determined through the claims. In addition, although some embodiments of the present disclosure are disclosed above, they are not intended to limit the scope of the present disclosure.

Reference throughout this specification to features, advantages, or similar language does not imply that all of the features and advantages that may be realized with the present disclosure should be or are in any single embodiment of the disclosure. Rather, language referring to the features and advantages is understood to mean that a specific feature, advantage, or characteristic described in connection with an embodiment is included in at least one embodiment of the present disclosure. Thus, discussions of the features and advantages, and similar language, throughout this specification may, but do not necessarily, refer to the same embodiment.

Furthermore, the described features, advantages, and characteristics of the disclosure may be combined in any suitable manner in one or more embodiments. One skilled in the relevant art will recognize, in light of the description herein, that the disclosure can be practiced without one or more of the specific features or advantages of a particular embodiment. In other instances, additional features and advantages may be recognized in certain embodiments that may not be present in all embodiments of the disclosure.

What is claimed is:

1. A micro light-emitting chip structure, comprising:
a first-type semiconductor layer;
a light-emitting layer disposed on the first-type semiconductor layer;
a second-type semiconductor layer disposed on one side of the light-emitting layer that is opposite the first-type semiconductor layer, wherein the second-type semiconductor layer has a peripheral surface and an end surface that is connected to the peripheral surface;
a first insulating layer covering at least the peripheral surface and the end surface;
a reflective layer disposed on the first insulating layer and covering at least the peripheral surface and the end surface;
a second insulating layer disposed on the reflective layer and covering at least the peripheral surface and the end surface;
an electrode disposed on the end surface and connected to the second-type semiconductor layer, wherein the electrode is adjacent to the reflective layer on the end surface; and
a dielectric structure between the electrode and the reflective layer, wherein the dielectric structure is connected to the first insulation layer and the second insulation layer and closes a part of the reflective layer that is adjacent to the electrode on the end surface, so as to electrically insulate the electrode from the reflective layer, and the dielectric structure is a ring structure formed between the first insulating layer and the second insulating layer and made of a different material than the first insulating layer and the second insulating layer.

2. The micro light-emitting chip structure as claimed in claim 1, wherein the electrode and the reflective layer completely cover the peripheral surface and the end surface.

3. The micro light-emitting chip structure as claimed in claim 1, wherein the first insulating layer, the reflective layer, and the second insulating layer conformally cover the peripheral surface and a part of the end surface.

4. The micro light-emitting chip structure as claimed in claim 3, wherein the peripheral surface is an inclined surface, and a cross-sectional width of the second-type semiconductor layer gradually narrows in a direction parallel to the light-emitting layer toward the electrode.

5. The micro light-emitting chip structure as claimed in claim 1, wherein a top surface and a bottom surface of the dielectric structure are respectively aligned with a top surface and a bottom surface of the part of the reflective layer on the end surface, and the dielectric structure have the same thickness as the reflective layer in a thickness direction perpendicular to the end surface.

6. The micro light-emitting chip structure as claimed in claim 1, wherein the first insulating layer, the dielectric structure, and the second insulating layer each have an annular contact surface with the electrode on the end surface, and the annular contact surface of the first insulating layer, the annular contact surface of the dielectric structure, and the annular contact surface of the second insulating layer are aligned with each other in a thickness direction of the end surface.

7. The micro light-emitting chip structure as claimed in claim 1, wherein the first insulating layer, the reflective layer, and the second insulating layer extend toward the light-emitting layer and the first-type semiconductor layer along the peripheral surface and cover the light-emitting layer and a part of the first-type semiconductor layer.

8. The micro light-emitting chip structure as claimed in claim 7, further comprising:

an ohmic contact layer covering at least a part of the first-type semiconductor layer, wherein the ohmic contact layer is connected to at least one of the first insulating layer, the reflective layer, and the second insulating layer.

9. The micro light-emitting chip structure as claimed in claim 8, wherein the ohmic contact layer is connected to the reflective layer, or is further connected to the second insulating layer.

10. The micro light-emitting chip structure as claimed in claim 9, wherein the reflective layer is a conductor.

11. The micro light-emitting chip structure as claimed in claim 1, wherein the first-type semiconductor layer has a light-emitting surface on one side facing away from the light-emitting layer, and a refractive structure is disposed on the light-emitting surface.

12. A micro display structure, comprising:

a display substrate;

micro light-emitting chip structures arranged on the display substrate, wherein each of the micro light-emitting chip structures comprises:

a first-type semiconductor layer;

a light-emitting layer disposed on the first-type semiconductor layer;

a second-type semiconductor layer disposed on one side of the light-emitting layer that is opposite the first-type semiconductor layer, wherein the second-type semiconductor layer has a peripheral surface and an end surface that is connected to the peripheral surface;

a first insulating layer covering at least the peripheral surface and the end surface;

a reflective layer disposed on the first insulating layer and covering at least the peripheral surface and the end surface;

a second insulating layer disposed on the reflective layer and covering at least the peripheral surface and the end surface;

an electrode disposed on the end surface and connected to the second-type semiconductor layer, wherein the electrode is adjacent to the reflective layer on the end surface; and a dielectric structure between the electrode and the reflective layer, wherein the dielectric structure is connected to the first insulation layer and the second insulation layer and closes a part of the reflective layer that is adjacent to the electrode on the end surface, so as to electrically insulate the electrode from the reflective layer, and the dielectric structure is a ring structure formed between the first insulating layer and the second insulating layer and made of a different material than the first insulating layer and the second insulating layer, wherein the electrode is electrically connected to the display substrate, and the first insulating layer, the reflective layer, and the second insulating layer extend toward the light-emitting layer and the first-type semiconductor layer along the peripheral surface and cover the light-emitting layer and a part of the first-type semiconductor layer; and an ohmic contact layer patterned between the micro light-emitting chip structures and electrically connected to the first-type semiconductor layer of the micro-light-emitting chip structures.

13. The micro display structure as claimed in claim 12, wherein the micro-light-emitting chip structures emit light of the same color, and the micro display structure further comprises:

color conversion structures disposed on some of the micro light-emitting chip structures, wherein the color conversion structures convert the light emitted by the micro light-emitting chip structures into light of different colors.

14. The micro display structure as claimed in claim 12, wherein the micro-light-emitting chip structures emit lights of different colors.

15. The micro display structure as claimed in claim 12, wherein there are gaps between the micro light-emitting chip structures to form trenches, the trenches are disposed between the ohmic contact layer and the electrodes in a thickness direction perpendicular to the end surface, and the micro display structure further comprises:

third insulating layers filling the trenches.

16. The micro display structure as claimed in claim 12, wherein the electrode and the reflective layer completely cover the peripheral surface and the end surface.

17. The micro display structure as claimed in claim 12, wherein the first insulating layer, the reflective layer, and the second insulating layer conformally cover the peripheral surface and a part of the end surface, the peripheral surface is an inclined surface, and a cross-sectional width of the second-type semiconductor layer gradually narrows in a direction parallel to the light-emitting layer toward the electrode.

18. The micro display structure as claimed in claim 12, wherein the ohmic contact layer is connected to the reflective layer, or is further connected to the second insulating layer.

19. The micro display structure as claimed in claim 18, wherein the reflective layer is a conductor.

20. The micro display structure as claimed in claim 12, wherein the first-type semiconductor layer has a light-emitting surface on one side facing away from the light-emitting layer, and the micro display structure further comprises:

a refractive structure disposed on the light-emitting surface.

* * * * *